United States Patent [19]

Rozema et al.

[11] Patent Number: 4,518,930

[45] Date of Patent: May 21, 1985

[54] NEGATIVE RESISTANCE CIRCUIT FOR VCO

[75] Inventors: John G. Rozema, Wheaton; William I. H. Chen, Naperville, both of Ill.

[73] Assignee: Rockwell International Corporation, El Segundo, Calif.

[21] Appl. No.: 403,896

[22] Filed: Jul. 30, 1982

[51] Int. Cl.³ .................. H03B 5/36; H03B 7/06; H03H 11/52; H03L 7/00

[52] U.S. Cl. .................. 331/36 C; 331/115; 331/116 R; 331/132; 331/177 V; 333/217

[58] Field of Search .................. 331/36 C, 61, 116 R, 331/115, 116 FE, 158, 159, 132, 177 V; 333/217

[56] References Cited

U.S. PATENT DOCUMENTS

| | | | |
|---|---|---|---|
| 3,986,152 | 10/1976 | Howell | 331/115 X |
| 4,230,999 | 10/1980 | Ahmed | 331/115 |
| 4,378,531 | 3/1983 | Gawler | 331/115 |

FOREIGN PATENT DOCUMENTS 2513653 9/1976 Fed. Rep. of Germany ...... 333/217

Primary Examiner—Eugene R. Laroche
Assistant Examiner—D. C. Mis

Attorney, Agent, or Firm—Carmen B. Patti; V. Lawrence Sewell; H. Fredrick Hamann

[57] ABSTRACT

A high-frequency negative resistance circuit for use in a voltage controlled crystal oscillator has a pair of input terminals thereby defining an input current and input voltage. The high-frequency negative resistance circuit includes a sensing circuit for sensing the input current, a biasing voltage source and a load impedance connected to the voltage source. The high-frequency negative resistance circuit further comprises a current mirror circuit connected to the sensing circuit and to the load impedance for producing a current in the load impedance. The current in the load impedance is approximately equal to the input current. The current mirror circuit also controls the sensing circuit to cause the input voltage to decrease as the input current increases. Decreasing input voltage with increasing input current defines the negative resistance. When this negative resistance circuit is configured with a crystal and a voltage controlled capacitance, an oscillator capable of high-frequency operation results. Oscillator parameters such as frequency pullability, startability, stability, temperature, and crystal drive are easily optimized and can be set by mutually independent selection of individual circuit element values. In particular, the crystal drive level is well controlled due to the well-defined limiting character of the negative resistance circuit.

10 Claims, 5 Drawing Figures

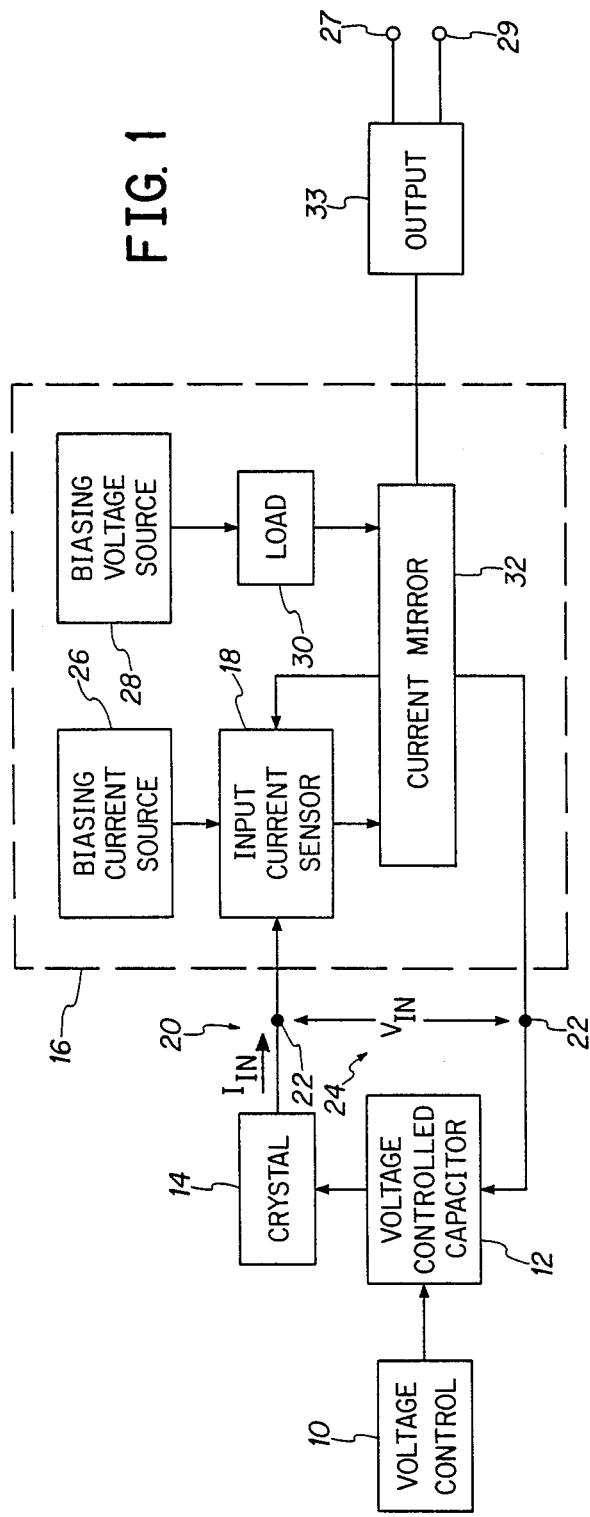
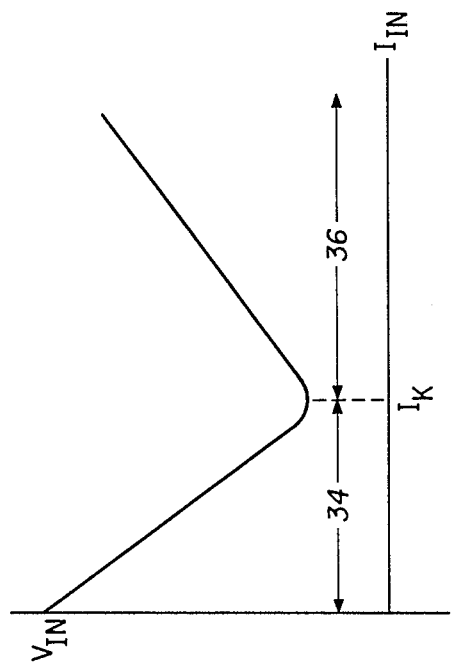

NEGATIVE RESISTANCE CIRCUIT FOR VCO

BACKGROUND OF THE INVENTION

This invention relates in general to voltage controlled oscillators and, in particular, to high-frequency oscillators using a negative resistance.

Numerous types of voltage controlled oscillators appear in the prior art. Typically, the frequency of the oscillation is adjusted by changing the load capacitance of the oscillator circuit. For example, this is the approach used in a standard Colpitts-type oscillator. However, because the capacitances of the various fixed circuit elements combine with the variable capacitance to form the net oscillator capacitance, the net change in th oscillator capacitance is not nearly as large as the change in the variable capacity. Hence, the frequency pullability of such voltage controlled crystal oscillators is limited, especially for practical voltage controlled variable capacitors. The problem can be reduced through choice of large capacitance circuit elements, but at a cost of deteriorated oscillator startability, stability, or crystal drive. Another solution would use the positive reactance of an inductor to null the negative reactance of the circuit capacitances. However, the temperature stability of even the most expensive inductors is generally worse than any other element in the oscillator circuit, so that the temperature stability of the oscillator is degraded. Thus, the inductor solution is both undesireable and expensive to implement. In conclusion, due to the adverse interrelationships between the circuit elements, it is difficult to design a Colpitts-type oscillator for optimum frequency pullability, stability, crystal drive, and startability. Another known approach is to form an oscillator through the use of a negative resistance. The oscillation will occur at a frequency such that the phase shift around a loop consisting of the negative resistance, crystal, and voltage variable capacitance is zero. Usually, the negative resistance is formed by multiplying an appropriate resistor in the circuit by minus one. The prior art discloses this gyration of resistances and general impedances, but these circuits are limited to low-frequency applications in ranges of a few tens of KHz or less.

It is also known that negative resistances can be simulated with the use of operational amplifiers. However, at frequencies upward to 10 MHz, these circuits are no longer practical in performance.

Another problem in the prior art is that in a crystal oscillator, the crystal drive must be set empirically. If the crystal is driven too hard, it dissipates too much energy and the crystal can be damaged. Also, the crystal can deteriorate over a period of time with over driving. Therefore, over driving the crystal can result in increased aging and spurious operation at undesired frequencies.

SUMMARY OF THE INVENTION

The novel, high-frequency negative resistance circuit for use in a voltage controlled crystal oscillator, has a pair of input terminals thereby defining an input current and an input voltage. The circuit comprises a means for sensing the input current, a biasing voltage source and a load impedance connected to the biasing voltage source. The circuit further comprises a current mirror means connected to the means for sensing and to the load impedance for producing a current in the load impedance. The current in the load impedance is approximately equal to the input current. The current mirror means also controls the means for sensing to cause the input voltage to decrease as the input current increases. Decreasing input voltage with increasing input current defines the negative resistance. When this negative resistor is configured with a crystal and a voltage controlled capacitance, an oscillator capable of high frequency operation results. Oscillator parameters such as frequency pullability, startability, stability, and crystal drive are easily optimized and can be set by mutually independent selection of individual circuit element values. In particular, the crystal drive level is well controlled due to the well defined limiting character of the negative resistor.

OBJECTS OF THE INVENTION

It is a general object of the present invention to provide a voltage controlled crystal oscillator.

It is a more specific object of the present invention to provide a crystal oscillator which utilizes a negative resistance circuit.

It is another object of the present invention to provide a voltage controlled crystal oscillator which is capable of oscillating at high frequencies.

It is a further object to provide a negative resistance circuit which has a low temperature sensitivity and is easily calibrated.

It is another object to provide a voltage controlled crystal oscillator which is inexpensive, yet dependable.

It is yet another object to provide a voltage controlled crystal oscillator in which the crystal drive level is well controlled and the various oscillator parameters are easily optimized for ease of calibration.

BRIEF DESCRIPTION OF THE DRAWINGS

The features of the present invention, which are believed to be novel, are set forth with particularity in the appended claims. The invention, together with further objects and advantages, may best be understood by reference to the following description taken in conjunction with the accompanying drawings, in the several figures of which like reference numerals identify like elements, and in which:

FIG. 1 is a block diagram representation of the novel voltage controlled crystal oscillator utilizing a negative resistance circuit.

FIG. 2 illustrates an equivalent circuit of the FIG. 1 block diagram.

FIG. 3 is a graph showing the relationship of input current to the input voltage for the negative resistance circuit.

DESCRIPTION OF THE PREFERRED EMBODIMENT

Figure 4:
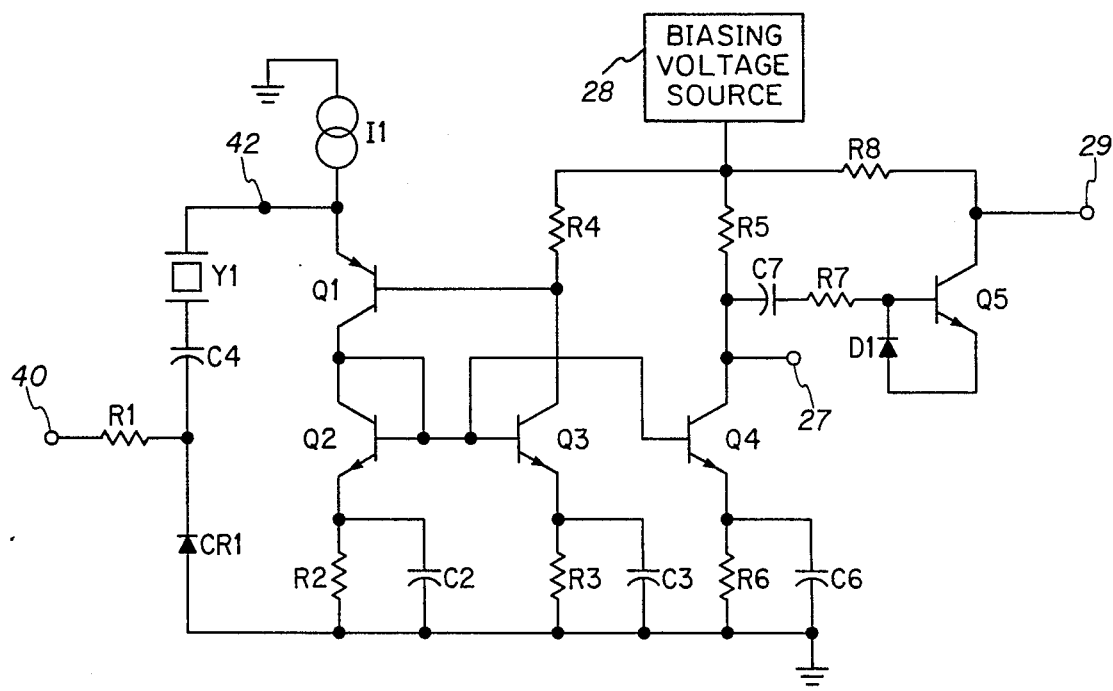
FIG. 4 is a schematic diagram of the novel voltage controlled crystal oscillator.

This invention pertains to a voltage controlled crystal oscillator utilizing a novel negative resistance circuit. The novel oscillator has good temperature stability and reliable performance. It is designed to operate in the high-frequency range for use as a clock unit for signal sampling functions.

In general terms, the present invention will now be described. The novel high-frequency negative resistance circuit for use in a voltage controlled crystal oscillator has a pair of input terminals, thereby defining an input current and an input voltage. The circuit comprises a means for sensing the input current, a biasing voltage source, and a load impedance connected to the biasing voltage source. The circuit further comprises a current mirror means connected to the means for sensing and to the load impedance for producing a current in the load impedance. The current in the load impedance is approximately equal to the input current. The current mirror means also controls the means for sensing to cause the input voltage to decrease as the input current increases. Decreasing input voltage with increasing input current defines the negative resistance.

Referring now to FIG. 1, a means for providing a variable voltage 10, applies a voltage to a means 12, for changing the load capacitance of the oscillator, such as a voltage controlled capacitor. The means 12 is connected to a crystal means 14 which determines the frequency of oscillation. A negative resistance circuit 16 is provided, and an equivalent circuit of the oscillator is shown in FIG. 2.

The negative resistance circuit 16 comprises a means 18 for sensing the input current 20. The circuit 16 has at least a pair of input terminals 22 for defining the input current 20 and an input voltage 24. A biasing current source 26 is connected to the means 18 and provides a biasing current.

A constant biasing voltage source 28 is provided and is connected to a load impedance 30. A current mirror means 32 is connected to the means 18 for sensing the input current 20 and to the load 30. The current mirror means 32 produces a current in the load impedance 30 which is approximately equal to the input current 20. The current mirror means 32 also controls the means 18 to cause the input voltage 24 to decrease as the input current increases. Thus, the circuit performs as a negative resistance.

The oscillator will start and will continue to oscillate as long as the magnitude of the negative resistance 16 is greater than the positive resistive losses of the crystal means 14 and the voltage controlled capacitor 12. The crystal operating point occurs at a frequency such that the reactive components of the capacitor 12, the crystal means 14, and the negative resistance 16 sum to zero. The present invention discloses a negative resistance circuit capable of operation from DC to hundreds of MHz.

An output circuit 33 senses the input current 20 and is controlled by the current mirror means 32. The output circuit 33 produces a sine wave waveform on terminal 27, and a corresponding square wave waveform on terminal 29. The frequency of the sine wave, and the square wave, is the frequency of oscillation of the novel circuit. The square wave may be utilized for logic circuit applications.

FIG. 3 is a graph of the input voltage 24 versus the input current 20. In normal operation, the input voltage 24 decreases as the input current 20 increases. Biasing current source 26 biases the negative resistance circuit 16 in a negative resistance region 34. Region 36 of the curve exhibits positive resistance. This positive slope occurs at currents larger than the knee current Ik. In this region, transistor elements forming the means 18 for sensing the input current 20 and the current mirror means 32 are saturated and the negative resistance reduces to a current divider circuit.

A preferred embodiment of the present invention is shown in FIG. 4. The variable voltage source 10 is connected to terminal 40, and is applied across blocking resistor R1 to change the capacitance of reverse varactor diode CR1, which is connected to R1. Increasing the voltage decreases the capacity of varactor diode CR1, reducing the equivalent load capacity of the oscillator, and thereby causing the crystal operating point to shift to a higher frequency.

A crystal Y1 and a capacitor C4 are connected in series between the varactor diode CR1 and an input terminal 42. C4 is generally not required, except that in the preferred embodiment it provides a voltage divider means for maintaining the AC voltage across CR1 at a value less than the minimum breakdown rating of the diode. Current source I1 provides the biasing current for the negative resistance current. A P-N-P type transistor Q1 forms the means 18 for sensing the input current. Q1 also serves as an emitter follower means for controlling input voltage by way of the connection of its base to R4. The emitter of Q1 is connected to the input terminal 42 and to the current source I1. The current mirror means 32 consists of N-P-N type transistors Q2 and Q3, resistors R2 and R3 and bypass capacitors C2 and C3. The bases of Q2 and Q3 are connected together and Q2 is an emitter follower with its base and collector connected to the collector of Q1. The collector of Q3 is connected to the base of Q1. Resistor R2 and capacitor C2 form a parallel circuit connected between the emitter of Q2 and ground. Similarly, resistor R3 and capacitor C3 form a parallel circuit connected between the emitter of Q3 and ground.

A resistor R4 is the load impedance 30 and is connected in series between the collector of transistor Q3 and biasing voltage source 28. Current flowing into the emitter of the transistor Q1 appears at the collector of transistor Q1 and flows into transistor Q2. Transistor Q3 causes an equal current to flow through R4, driving the base, and hence the emitter voltage of transistor Q1 more negative. Increasing input current therefore, results in decreasing voltage at the input, until the current knee, Ik, is reached when transistor Q3 saturates.

Prior to saturation, the negative slope of the curve in FIG. 3 is determined by the value of R4, the current gain of the transistors, and the matching of resistors R2 and R3. At large input currents, such that Q3 is saturated, the input current is applied to a current divider, resistors R2, R3 and R4, and the input impedance is positive.

It is important that in all cases the circuit resistance be more negative than the resistance of the crystal Y and the voltage controlled capacitor 12. As an example, consider the following which is not intended to limit the scope of the invention but rather to demonstrate a design procedure for the preferred embodiment.

An analysis of the circuit of the preferred embodiment discloses that a negative resistance of at least 75% of R4 is achieved when the current gain of Q1 is greater than 40, Q2 and Q3 are worst case mismatched such that the Q2 current gain is 100, the Q3 gain is 40, and the base-emitter mismatch is ±5 millivolts (input offset voltage). Such transistors are readily and economically available, although higher performance components can also be obtained. Thus, if an R4 of 150 ohms is selected, then for all cases the circuit is more negative than −112 ohms. Furthermore, the crystal 11 selected for the preferred embodiment exhibits less than 75 ohms within the design load range of 15 pF to 30 pF, and the varactor diode contributes less than 6 ohms loss in the worst case. Therefore, the total circuit resistance is negative with at least 31 ohms margin, and oscillator startup is guaranteed under all conditions.

If the circuit resistance is more negative than the crystal Y and varactor diode CR1, crystal oscillations will build up until the amplitude of crystal current exceeds the knee current Ik and the circuit resistance becomes positive.

In the preferred embodiment, emitter resistors R2 and R3 are selected for a knee current of 7.5 milliamps. Since a 13 volt supply selected for the biasing voltage source item 28, and since R4 is chosen for startability to be 150 ohms, 1600 ohms were therefore required. Actually, the crystal current slightly exceeds Ik, thereby dissipating the energy gained during the negative resistance region 36 in FIG. 3. A 9 milliamp peak-to-peak current was observed, so that the crystal drive level for a typical 25 ohm crystal is 250 microwatts. Thus, crystal drive level is both well controlled and easily optimized by choice of a proper value for R2, R3, and R6.

A final requirement for oscillation is a current source means which will bias the circuit within the negative resistance region. The prior art has established many methods for constructing a current source, any of which may be used providing that its source impedance is high. Preferably, the bias should be at the midway point of the negative resistance region, near one-half Ik. In the preferred embodiment, a very simple current source was constructed by means of a 1200 ohm resistor connected to a well regulated voltage source of 18 volts, 5 volts greater than the biasing voltage source 28, thereby creating a nearly vertical load line which intersects the negative resistance curve at approximately 4 milliamps.

The negative resistance circuit is designed for minimal phase shift at the 10 MHz operating frequency so that oscillator load capacity will not be affected by circuit variations. The cut-off frequency of the current mirror is ½ the unity gain frequency Ft of Q2 and Q3, or 150 MHz for the transistors used in the preferred embodiment. The cut-off frequency of emitter-follower Q1 occurs at its unity gain frequency Ft, which is 200 MHz for the transistors in the preferred embodiment. Thus, the frequency response limitations of the transistors do not add significant phase shift. A more significant cause of phase shift is the collector-to-base capacity Ct of Q1 and Q3. By-pass capacitors C2 and C3 minimize but do not eliminate this effect. A pole still exists at $$W3\ db = 1/[2 \times R4 \times Ct]$$

where Ct is the sum of the collector to base capacitances of Q1 and Q3. For a Ct value of 9 pF and R4 of 150 ohms, the cut-off frequency is 58 MHz so that the phase shift at the 10 MHz operating frequency is small. The phase shift can be easily reduced by raising the cut-off frequency through use of transistors with smaller base collector capacity.

Thus, the load capacity of the oscillator is determined primarily by C4 and CR1. For the varactor diode CR1 chosen in the preferred embodiment, CR1 provides 100 pF to 150 pf at 2 volts reverse bias, and 8 to 13 pF at 10 volts. Thus, the series combination of C4 and CR1 can swing from less than 10.5 pF to more than 30.5 pF. The crystal is specified to shift frequency from plus 100 Hz at 15 pF to minus 100 Hz at 30 pF. This allows for 5 pF stray capacity and allows for a plus or minus 50 Hz capture range in phase locked loop applications even if the voltage controlled oscillator is offset in the worst case by plus or minus 50 Hz (temperature and/or aging.)

The output circuit 33 will now be described. Transistor Q4 extends the current mirror means, since its base is connected to the bases of transistors Q2 and Q3. For undistorted sinosoidal output, crystal current is the proper signal to sense, since the voltage waveform is distorted by the foldback of the Vin versus Iin curve at Ik. Transistor Q4, therefore, reflects this relatively undistorted crystal current into resistor R5, thereby driving the sine to square wave converter, transistor Q5. Transistor Q5 provides an output square wave at terminal 29, which is compatible for driving TTL or CMOS logic circuits. Alternatively, a sine wave output at terminal 27 could be used if required by the application.

Resistor R5 is connected in series between biasing voltage source 28 and the collector of transistor Q4. A parallel circuit of resistor R6 and capacitor C6 connects the emitter of Q4 to ground.

Series circuit, capacitor C7 and resistor R7, AC couple the collector of transistor Q4 to the base of transistor Q5. Resistor R8 connects the collector of transistor Q5 to voltage source 28 and diode D1 connects to base of transistor Q5 to ground. Terminal 27 is connected to the collector of transistor Q4, and terminal 29 is connected to the collector of transistor Q5.

Figure 5:
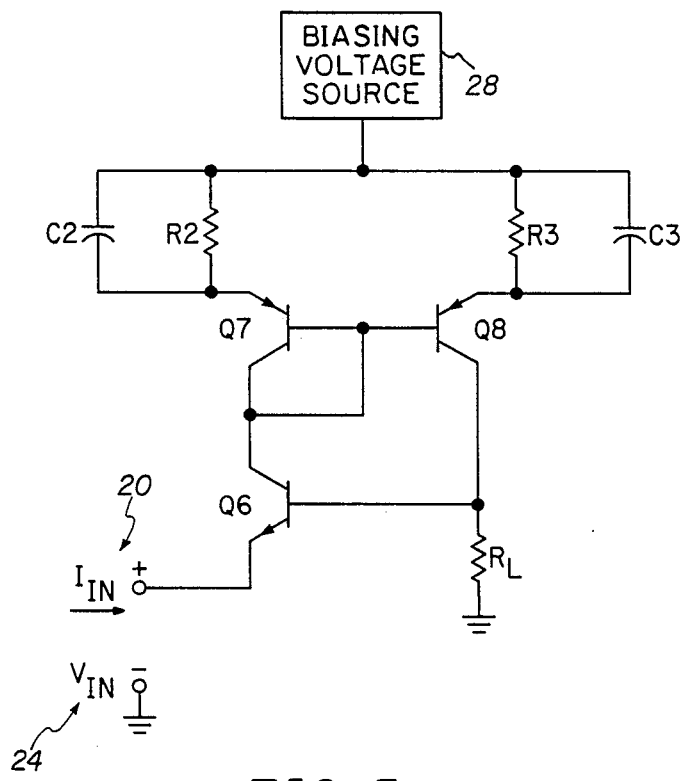
FIG. 5 is an alternative embodiment of the negative resistance circuit.

An alternative embodiment of negative resistance circuit 16 is shown in FIG. 5. This embodiment utilizes a N-P-N type transistor Q6 for the means 18 for sensing the input current 20, and a pair of P-N-P type transistors, Q7 and Q8, for the current mirror means 32. Resistor RL is the load for the circuit. The circuit described in FIG. 4 is preferred because in the prior art, P-N-P transistors such as Q7 and Q8 generally have a lower unity gain bandwidth than N-P-N transistors such as Q6. That is, the preferred embodiment of FIG. 4 uses the full gain bandwidth of the limited bandwidth P-N-P transistor, Q1, through the use of an emitter follower configuration; whereas the alternate embodiment of FIG. 5 uses only half the gain bandwidth due to the current mirror configuration of Q5 and Q6. However, the preferred embodiment for a particular application may vary depending upon the bandwidth of the transistors available for implementation.

The invention is not limited to the particular details of the circuit depicted and other modifications of the application are contemplated. Certain other changes may be made in the above described circuit without departing from the true spirit and scope of the invention herein involved. It is intended, therefore, that the subject matter in the above depiction shall be interpreted as illustrative and not in a limiting sense.

What is claimed is:

1. A high-frequency negative resistance circuit having at least one pair of input terminals, thereby defining an input current at said input terminals which causes a voltage at said input terminals, said circuit comprising:
    means for sensing the input current;
    a biasing voltage source;
    a load impedance connected to said biasing voltage source; and
    current mirror means connected to said means for sensing and to said load impedance for producing a current in said load impedance approximately equal to said input current and for controlling said means for sensing to cause the voltage at the input terminal to decrease as the input current increases and to increase as the input current decreases, when the input current is less than a knee current.

2. The high frequency negative resistance circuit of claim 1 further comprising a current source connected to said means for sensing the input current to provide a biasing current.

3. The high frequency negative resistance circuit of claim 2 wherein said means for sensing the input current is an P-N-P type transistor having its emitter connected to the input terminal and to said current source.

4. The high frequency negative resistance circuit of claim 1 wherein said means for sensing is a transistor and said current mirror means comprises a first and second NPN type transistors having their bases connected together, the collector of said first transistor connected to its own base and to the collector of said transistor in said means for sensing, the collector of said second transistor connected to the base of said transistor in said means for sensing and to said load impedance, and emitters of each of said first and second transistors each connected to respective parallel resistor-capacitor networks.

5. A voltage controlled crystal oscillator comprising:
crystal means for determining the frequency of oscillation of the oscillator;
means for providing a variable voltage:
means for changing the load capacitance of the oscillator responsive to said means for providing a variable voltage;
current source means for providing a biasing current;
means for sensing an input current having an input terminal connected to said crystal means and to said current source means;
a constant biasing voltage source;
a load impedance connected to said constant voltage source; and
current mirror means connected to said means for sensing and to said load impedance for producing a current in said load impedance approximately equal to said input current and for controlling said means for sensing to cause an input voltage to decrease at said input terminal as said input current increases.

6. The oscillator described in claim 5 wherein said means for changing the load capacitance of the oscillator is a voltage variable capacitor.

7. The oscillator described in claim 5 wherein said means for sensing said input current is an P-N-P type transistor having its emitter connected to said crystal means, and said current source means.

8. The oscillator described in claim 7 wherein said current mirror means comprises a first and second N-P-N type transistors having their bases connected together, the collector of said first transistor connected to its own base and to the collector of said transistor in said means for sensing, the collector of said second transistor connected to the base of said transistor in said means for sensing and to said load impedance, and emitters of each of said first and second transistors each conected to parallel resistor-capacitor networks.

9. The voltage controlled crystal oscillator of claim 5, further comprising an output circuit having a transistor means connected to said current mirror means for sensing a crystal current, and for outputing a sine wave voltage waveform at an output terminal of said oscillator.

10. The output circuit described in claim 9, wherein said output circuit further comprises a converter means connected to said transistor means for converting said sine wave voltage waveform to a square wave voltage waveform at an output terminal of said oscillator.

* * * * *